(12) United States Patent
Park

(10) Patent No.: US 6,784,479 B2
(45) Date of Patent: Aug. 31, 2004

(54) MULTI-LAYER INTEGRATED CIRCUIT CAPACITOR ELECTRODES

(75) Inventor: Je-min Park, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/435,880

(22) Filed: May 12, 2003

(65) Prior Publication Data

US 2003/0227044 A1 Dec. 11, 2003

(30) Foreign Application Priority Data

Jun. 5, 2002 (KR) .............................. 10-2002-0031678
Jul. 10, 2002 (KR) .............................. 10-2002-0040092

(51) Int. Cl.[7] .............................................. H01L 29/76
(52) U.S. Cl. ...................................... 257/308; 438/239
(58) Field of Search .............................. 257/304, 316, 257/308–309, 331; 438/239

(56) References Cited

U.S. PATENT DOCUMENTS 6,258,691 B1    7/2001  Kim
6,544,841 B1 *  4/2003  Ciavatti ...................... 438/254

* cited by examiner

Primary Examiner—David Nelms
Assistant Examiner—David Vu
(74) Attorney, Agent, or Firm—Myers Bigel Sibley & Sajovec

(57) ABSTRACT

Integrated circuit capacitor electrodes include a first conductive ring on a face of an integrated circuit substrate. A second conductive ring is provided on the first conductive ring opposite the substrate. A third conductive ring also is provided on the first conductive ring opposite the substrate. The third ring is located at least partially within the second ring. A conductive layer electrically connects the first, second and third rings. To form the electrodes, a first conductive layer is conformally deposited in the areas in which the electrodes will be formed and on a mold oxide layer. A first buffer dielectric layer is deposited on the first conductive layer. The first buffer dielectric layer and the first conductive layer are etched to separate nodes of the first conductive layer. Recessed portions are formed by further etching the first conductive layer. The mold oxide layer and the first buffer dielectric layer deposited beside the recessed portions are etched to define areas in which the upper storage electrodes of dual cylindrical type are formed. A second conductive layer is conformally deposited in the areas in which the upper storage electrodes are formed and on the mold oxide layer and the buffer dielectric layer.

16 Claims, 10 Drawing Sheets

MULTI-LAYER INTEGRATED CIRCUIT CAPACITOR ELECTRODES

RELATED APPLICATIONS

This application claims the benefit of Korean Patent Application No. 2002-0031678, filed Jun. 5, 2002, and Korean Application No. 2002-0040092, filed Jul. 10, 2002, the disclosures of both of which are hereby incorporated herein by reference in their entirety as if set forth fully herein.

FIELD OF THE INVENTION

The present invention relates to integrated circuit devices and fabrication methods therefor, and more particularly to integrated circuit capacitor devices and fabrication methods therefor.

BACKGROUND OF THE INVENTION

Integrated circuit capacitors are widely used in integrated circuit devices. For example, in Dynamic Random Access Memory (DRAM) devices, integrated circuit capacitors may be used to store charge thereon, and thereby store data. As the integration density of integrated circuit devices, such as DRAM devices, continues to increase, it may be desirable to maintain sufficiently high storage capacitance while decreasing the area of the integrated circuit substrate that is occupied by each capacitor.

In order to increase the amount of capacitance per unit area of the integrated circuit substrate, it is known to use three-dimensional capacitor structures that can increase the effective area thereof. One type of three-dimensional capacitor structure is a cylindrical capacitor. Cylindrical capacitors are well known to those having skill in the art and are described, for example, in U.S. Pat. No. 6,258,691, entitled *Cylindrical Capacitor and Method for Fabricating Same*, assigned to the assignee of the present application, the disclosure of which is hereby incorporated herein by reference in its entirety as if set forth fully herein.

As is well known to those having skill in the art, an integrated circuit capacitor generally includes a first or lower electrode, also referred to as a storage node, a dielectric layer on the first or lower electrode, and a second or upper electrode on the dielectric layer opposite the first or lower electrode. In a cylindrical capacitor, at least part of the lower electrode is cylindrical in shape.

A conventional semiconductor memory device having cylindrical capacitor lower electrodes and a conventional method of manufacturing the same will be described with reference to FIGS. 1 and 2. As shown in FIGS. 1 and 2, an interlevel insulating layer 110 is deposited on a semiconductor substrate 100 having semiconductor devices (not shown) such as metal oxide semiconductor (MOS) transistors. Storage node contact plugs (hereinafter referred to as contact plugs) 115 are formed in the interlevel insulating layer 110.

Capacitor lower electrodes 120a and 120b having cylindrical shapes are formed on the contact plugs 115 and predetermined portions of the interlevel insulating layer 110. The capacitor lower electrodes 120a and 120b are composed of bottoms 120b, which are electrically connected to the contact plugs 115 and sidewalls 120a, which extend from the bottoms 120b upward, to a predetermined thickness, so as to be perpendicular to the bottoms 120b. The capacitor lower electrodes 120a and 120b, i.e., the bottoms 120a enclosed by the sidewalls 120a, may be circular, elliptical, or polygonal such as rectangular. Spaces in the sidewalls 120a are vacant and open. A dielectric layer and capacitor upper electrodes are formed on the resultant structure so as to complete the capacitors.

A method of manufacturing the capacitor lower electrodes 120a and 120b that are cylindrically shaped will now be briefly described. First, an etch stopper (not shown) and a mold oxide layer (not shown) are sequentially deposited on the interlevel insulating layer 110 having the contact plugs 115. The mold oxide layer is formed to a thickness of about 15,000 Å. The mold oxide layer and the etch stopper are selectively etched using photolithography and an etching process so as to define areas in which capacitor lower electrodes will be formed. The contact plugs 115 are exposed in the areas in which the capacitor lower electrodes will be formed. Next, a conductive layer (not shown) is conformally deposited to a predetermined thickness in the areas in which the capacitor lower electrodes will be formed and on the mold oxide layer, and then a buffer dielectric layer (not shown) is deposited on the conductive layer.

Thereafter, the buffer dielectric layer and the conductive layer are etched until the surface of the mold oxide layer is exposed so as to separate nodes of the conductive layer. For the etching process, Chemical Mechanical Polishing (CMP) and/or dry etch back is used. Remaining portions of the buffer dielectric layer and the mold oxide layer are removed using wet etching so as to make the capacitor lower electrodes 120a and 120b cylindrical.

Unfortunately, capacitors including the capacitor lower electrodes (120a and 120b) which are cylindrical may have the following problems. As the density of the devices increases, areas of the bottoms 120b may continue to be reduced. Thus, if heights of the sidewalls 120a do not increase, capacitors having a desired capacitance may not be obtained. However, when increasing the heights of the sidewalls 120a in order to increase the capacitance, the entire arrangement of devices formed under and over the capacitors may change. Moreover, if the heights of the sidewalls 120a are too great, the ratio of the heights of the sidewalls 120 to the widths of the bottoms 120b may be too great. Due to this aspect ratio, the capacitor lower electrodes 120a and 120b may become slanted, which may cause the semiconductor device to have defects.

SUMMARY OF THE INVENTION

According to some embodiments of the present invention, integrated circuit capacitor electrodes are manufactured by depositing a first layer, which may be a mold oxide layer, on a semiconductor substrate. The mold oxide layer is patterned so as to define areas in which capacitor lower electrodes will be formed. A conductive layer is conformally deposited on the areas in which capacitor lower electrodes will be formed and on the patterned mold oxide layer. A second layer, which may be a buffer dielectric layer, is formed on the conductive layer. Nodes of the conductive layer are separated by etching the buffer dielectric layer and the conductive layer. The conductive layer is further etched between the mold oxide layer and the buffer dielectric layer to form recessed portions of the conductive layer.

The process of forming the recessed portions may be performed in situ with or apart from a process of separating the nodes of the conductive layer. In some embodiments, the process of forming the recessed portions and the process of etching the buffer dielectric layer and the conductive layer are performed using dry etch back.

According to other embodiments of the present invention, there is also provided a method of manufacturing a semiconductor memory device including capacitor lower electrodes composed of lower and upper storage electrodes. The upper storage electrodes, which are dual cylindrical type electrodes composed of bottoms and first and second sidewalls having different sizes, are formed on the lower storage electrodes, nodes of which are separated and recessed. The bottoms are positioned on the sidewalls of the lower storage electrodes and are formed between lower edges of the first sidewalls and lower edges of the second sidewalls but not inside of the lower edges of the second sidewalls.

In some embodiments, when forming the lower storage electrodes, a first conductive layer is conformally deposited in the areas in which the lower storage electrodes will be formed and on the mold oxide layer. A first buffer layer, which may be a first buffer dielectric layer, is deposited on the first conductive layer. The first buffer dielectric layer and the first conductive layer are etched to separate nodes of the first conductive layer. Recessed portions are formed by further etching the first conductive layer.

In some embodiments, etching the first conductive layer is performed using dry etch back. Etching the first conductive layer and forming the recessed portions may be sequentially performed in situ. The first conductive layer may be formed of a material having good etch selectivity to the mold oxide layer and first buffer dielectric layer.

In some embodiments, when forming the upper storage electrodes, the mold oxide layer and the first buffer dielectric layer deposited beside the recessed portions are etched to define areas in which the upper storage electrodes of dual cylindrical type are formed. A second conductive layer is conformally deposited in the areas in which the upper storage electrodes are formed and on the mold oxide layer and the buffer dielectric layer. A second buffer layer, such as a second buffer dielectric layer, is deposited on the second conductive layer. The upper storage electrodes are formed by etching the second buffer dielectric layer and the second conductive layer. Remaining portions of the mold oxide layer, the first buffer dielectric layer, and the second buffer dielectric layer are removed.

In some embodiments, the thickness of the lower storage electrodes is within the range of about 100–500 Å and the thickness of the upper electrodes is within the range of about 100–400 Å. After the upper storage electrodes are formed, a dielectric layer adjacent to the lower capacitor electrodes may be formed. Next, capacitor upper electrodes adjacent to the dielectric layer may be formed, to complete the capacitor.

According to still other embodiments of the present invention, there is also provided a semiconductor memory device including bilayered capacitor lower electrodes having lower storage electrodes and upper storage electrodes. The lower storage electrodes are single cylindrical type electrodes, and the upper storage electrodes are dual cylindrical type electrodes composed of bottoms and first and second sidewalls having different sizes. The bottoms are positioned on the sidewalls of the lower storage electrodes and are formed between lower edges of the first sidewalls and lower edges of the second sidewalls, but not inside of the lower edges of the second sidewalls.

The capacitor lower electrodes may be formed of polysilicon or a metal material. In some embodiments, the height of the upper storage electrodes accounts for 10–90% of the height of the capacitor lower electrodes. In some embodiments, the thickness of the lower storage electrodes is within the range of about 100–500 Å and the thickness of the upper storage electrodes is within the range of about 100–400 Å.

The circumferential shapes of the lower and upper storage electrodes may be polygonal, elliptical, or circular. A dielectric layer which is arranged adjacent to the capacitor lower electrodes may be further formed. Capacitor upper electrodes which are arranged adjacent to the dielectric layer may be further formed.

Integrated circuit capacitor electrodes according to other embodiments of the present invention comprise a first conductive ring on a face of an integrated circuit substrate and including a first ring axis that extends orthogonal to the face. A second conductive ring is provided on the first conductive ring opposite the substrate, and including a second ring axis that extends orthogonal to the face. A third conductive ring also is provided on the first conductive ring opposite the substrate, and including a third ring axis that extends orthogonal to the face. The third ring is located at least partially within the second ring. A conductive layer electrically connects the first, second and third rings. In some embodiments, the first conductive ring, the second conductive ring and/or the third conductive ring are ellipsoidal (for example elliptical or circular) or polygonal (for example square or hexagonal) in shape. Moreover, in other embodiments, the first, second and third conductive rings are coaxial. In still other embodiments, the perimeter of the second ring is greater than that of the first ring, and the perimeter of the third ring is less than that of the first ring. In still other embodiments, the conductive layer comprises a fourth ring that extends between the second and third rings adjacent the first ring, but not within the third ring.

Other embodiments of the present invention provide integrated circuit capacitor electrodes, which may function as intermediate structures in fabrication methods that were described above, and which comprise an integrated circuit substrate including a face and an insulating layer on the face of the integrated circuit substrate. A conductive ring is provided in the insulating layer. The ring includes a ring axis that extends orthogonal to the face, first and second ring walls, a ring floor adjacent the face and a ring roof remote from the face. The insulating layer includes a trench therein that exposes the ring roof but does not expose the ring walls. In some embodiments, the conductive ring is ellipsoidal or polygonal in shape.

According to yet other embodiments of the present invention, integrated circuit capacitor lower electrodes are manufactured by forming a first layer, such as a mold oxide layer, on a semiconductor substrate. The mold oxide layer is patterned to define areas in which the capacitor electrodes are formed. A conductive layer is conformally deposited in the areas in which the capacitor electrodes are formed and on the patterned mold oxide layer. A buffer layer, such as a buffer dielectric layer, is formed on the conductive layer. The buffer dielectric layer and the conductive layer are etched to separate nodes of the conductive layer. Recessed portions are formed between the mold oxide layer and buffer dielectric layers by further etching the conductive layer. The mold oxide layer and the buffer dielectric layer are etched deeper than the recessed portions to define areas in which caps will be formed. A dielectric layer is formed in the areas in which the caps will be formed. The caps are formed by planarizing the mold oxide layer, the buffer dielectric layers, and the dielectric layer. At least some of a remaining portion of the mold oxide layer and at least some of a remaining portion of the buffer dielectric layer are removed.

When defining the area in which the caps are formed, the mold oxide layer between adjacent capacitor lower electrodes may be patterned in all widthwise and lengthwise directions so that the mold oxide layer remains higher than the recessed portions. Also, the mold oxide layer between adjacent capacitor lower electrodes may be patterned in a first direction such that the mold oxide layer remains deeper than the recessed portions and in a second direction such that the mold oxide layer remains higher than the recessed portions. In some embodiments, the circumferential shapes of the capacitor lower electrodes are elliptical, and the first direction is the minor axis direction of the circumferential shapes.

In other embodiments, the dielectric layer is formed of a dielectric material such as a silicon nitride layer or the like. The caps may be formed using chemical mechanical polishing and/or dry etch back. The mold oxide layer, the buffer dielectric layer, and the dielectric layer are patterned so as to be higher than or equal height to the capacitor lower electrodes.

According to other embodiments of the present invention, a semiconductor memory device includes a semiconductor substrate, a plurality of cylindrical capacitor lower electrodes which are formed in an array on the semiconductor substrate, and caps which are formed so as to enclose upper portions of sidewalls of the capacitor lower electrodes. Adjacent caps may be separated from each other or may be connected to each other only in one direction. Also, the capacitor lower electrodes may be elliptical, in which case the caps may be connected to each other in the minor axis direction of the capacitor lower electrodes. The caps may be alternatively formed on the capacitor lower electrodes. In some embodiments, the caps are formed of a dielectric material such as silicon nitride (SiN). The heights of the caps may be equal to or higher than the heights of the capacitor lower electrodes.

Integrated circuit capacitor electrodes according to other embodiments of the invention include an integrated circuit substrate having a face and a conductive ring on the face of the integrated circuit substrate. The conductive ring includes a ring axis that extends orthogonal to the face, first and second ring walls, a ring floor adjacent the face, and a ring roof remote from the face. A conformal insulating cap is provided on the roof and extending on the first ring wall only partially to the floor. In other embodiments, the conformal insulating cap also extends on the second ring wall only partially to the floor. In still other embodiments, the conductive ring is ellipsoidal or polygonal in shape.

DETAILED DESCRIPTION

Figure 1:
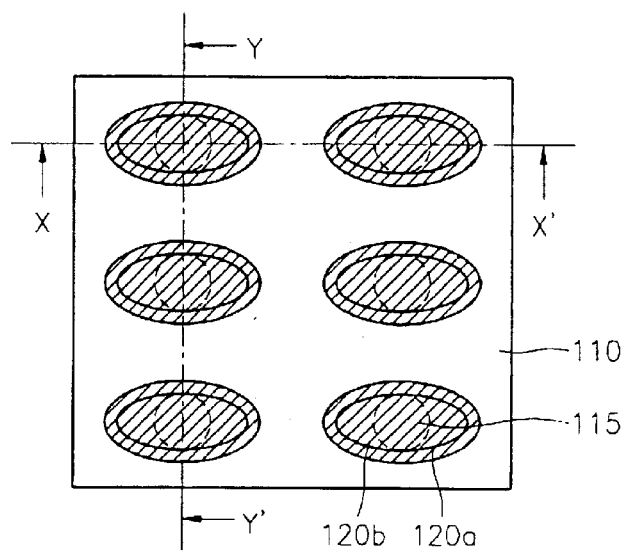
FIG. 1 is a plan view of a semiconductor memory device having conventional cylindrical capacitor lower electrodes.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

Figure 6:
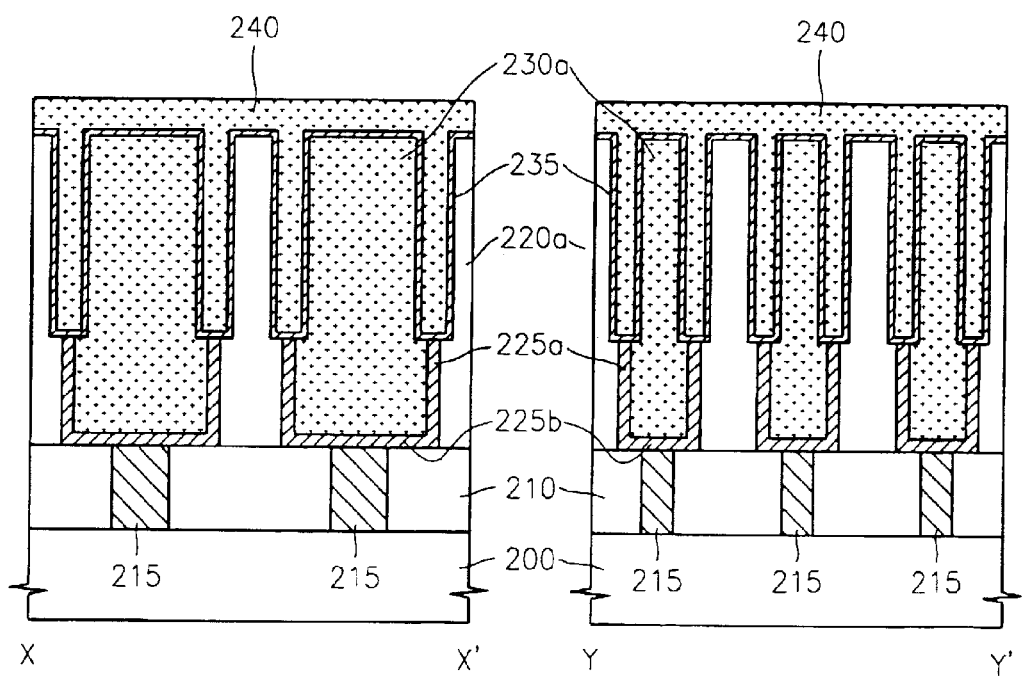
Figure 7:
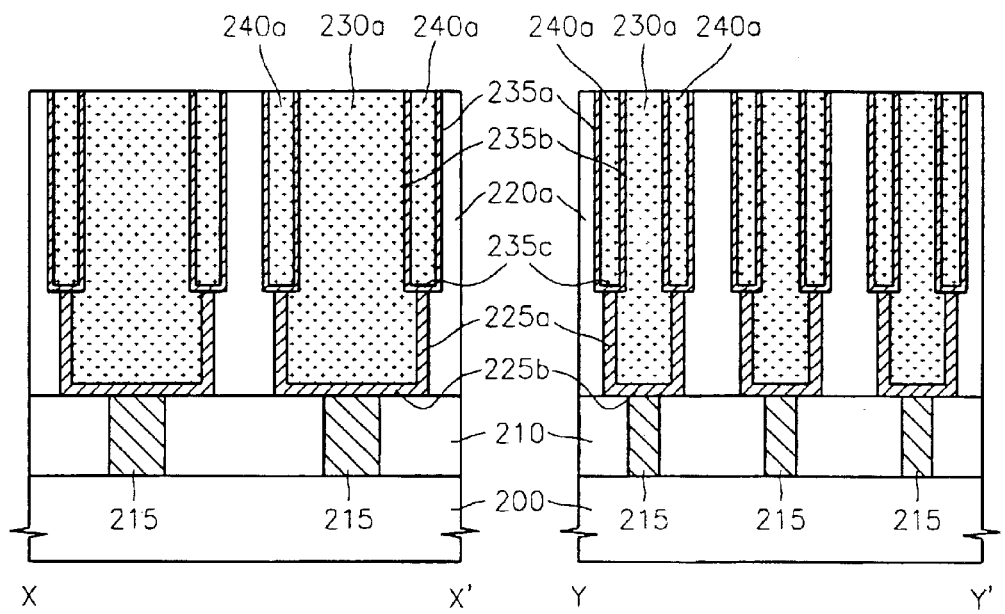
Figure 8:
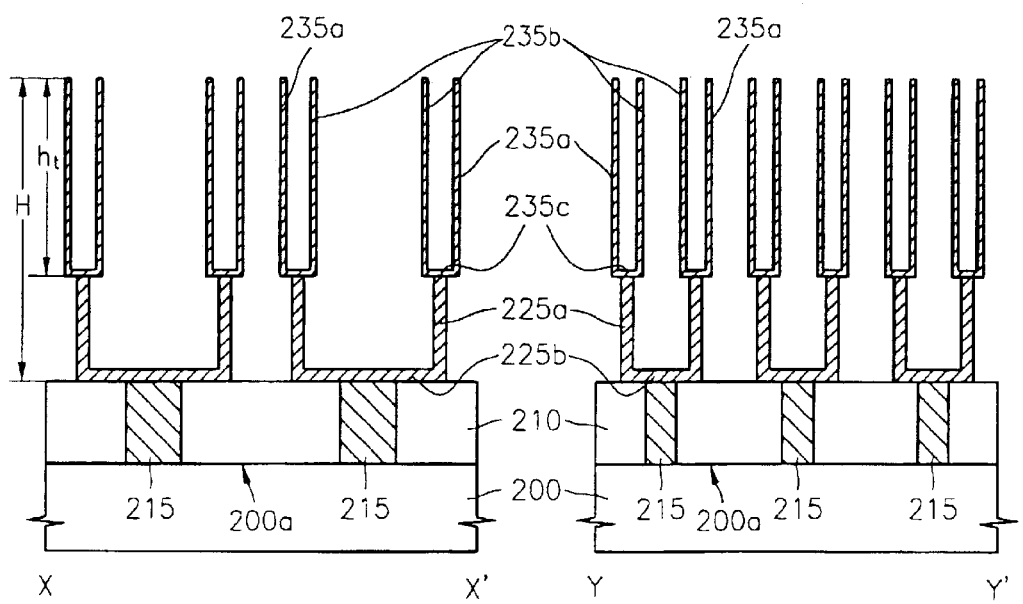
Figure 9:
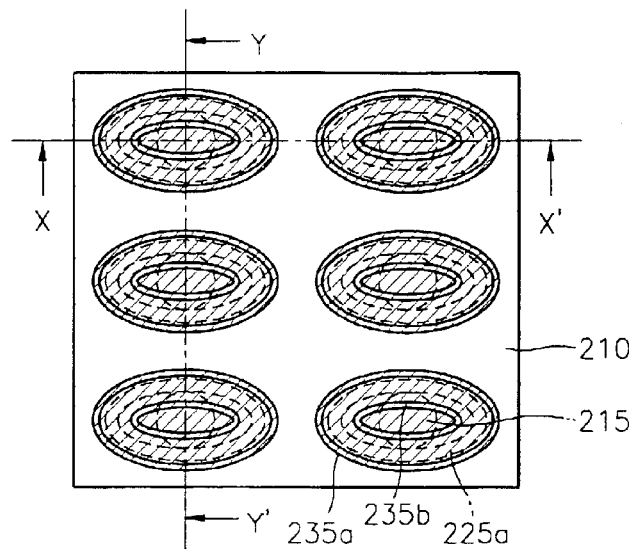
FIG. 9 is a plan view of semiconductor memory devices of FIG. 8.

FIGS. 3 through 8 are cross-sectional views of methods of manufacturing semiconductor memory devices according to first embodiments of the present invention, and FIG. 8 shows resultant structures manufactured according to the methods. Also, a plan view of semiconductor memory devices of FIG. 8 is shown in FIG. 9, and lines X–X' and Y–Y' of FIGS. 3 through 8 are cross-sectional views taken along lines X–X' and Y—Y of FIG. 9.

Figure 3:
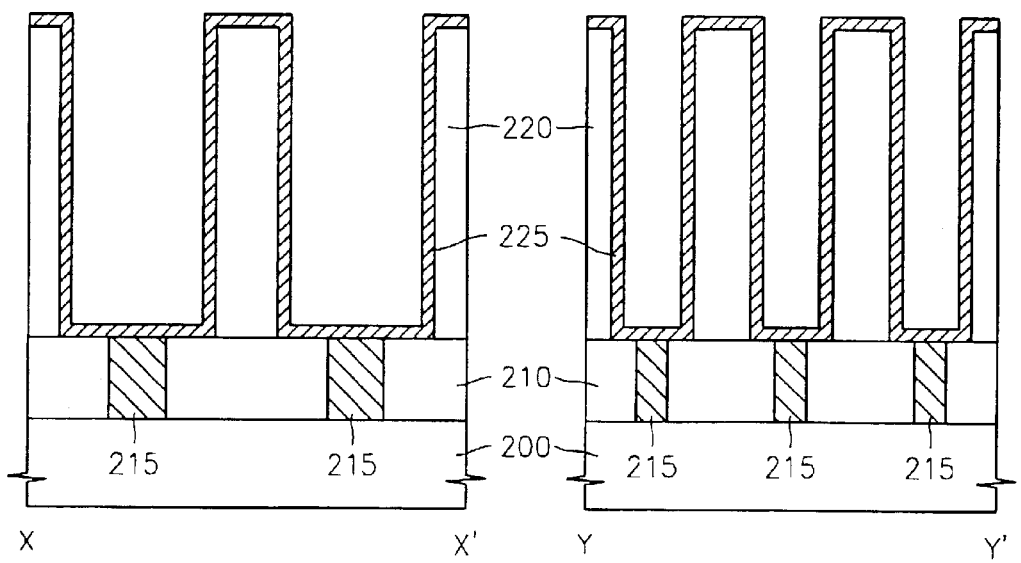
FIGS. 3 through 8 are schematic cross-sectional views of methods of manufacturing a semiconductor memory device according to embodiments of the present invention.

First, referring to FIG. 3, an interlevel insulating layer 210 is deposited on an integrated circuit substrate such as a semiconductor substrate 200 in which devices such as MOS transistors (not shown) are formed, and then a process of forming contact plugs 215 in the interlevel insulating layer 210 is performed according to a conventional method. Next, an etch stopper (not shown) using a silicon nitride layer or the like is deposited on the interlevel insulating layer 210 and the contact plugs 215, and a first layer such as a mold oxide layer 220 is deposited on the etch stopper. The mold oxide layer 220 is formed of plasma enhanced tetraethyl orthosilicate (PETEOS) or the like. Also, the mold oxide layer 220 is deposited to be thick in consideration of the heights of capacitor lower electrodes to be formed, e.g., to a thickness of about 10000–20000 Å. However, in other embodiments, the mold oxide layer 220 may be formed to a thickness of about two-thirds the thickness of a conventional mold oxide layer.

Thereafter, the mold oxide layer 220 and the etch stopper are sequentially etched using photolithography and an etching process so as to define areas in which the capacitor lower electrodes will be formed. The contact plugs 215 are exposed in the areas in which the capacitor lower electrodes will be formed. Next, a first conductive layer 225, which will be used as lower storage electrodes, is conformally deposited. In some embodiments, the first conductive layer 225 is deposited to a thickness of about 100–500 Å. The first conductive layer 225 may be formed of polysilicon but may be formed of a metal material since the first conductive layer 225 may be formed to be thinner using the metal material than polysilicon.

Figure 4:
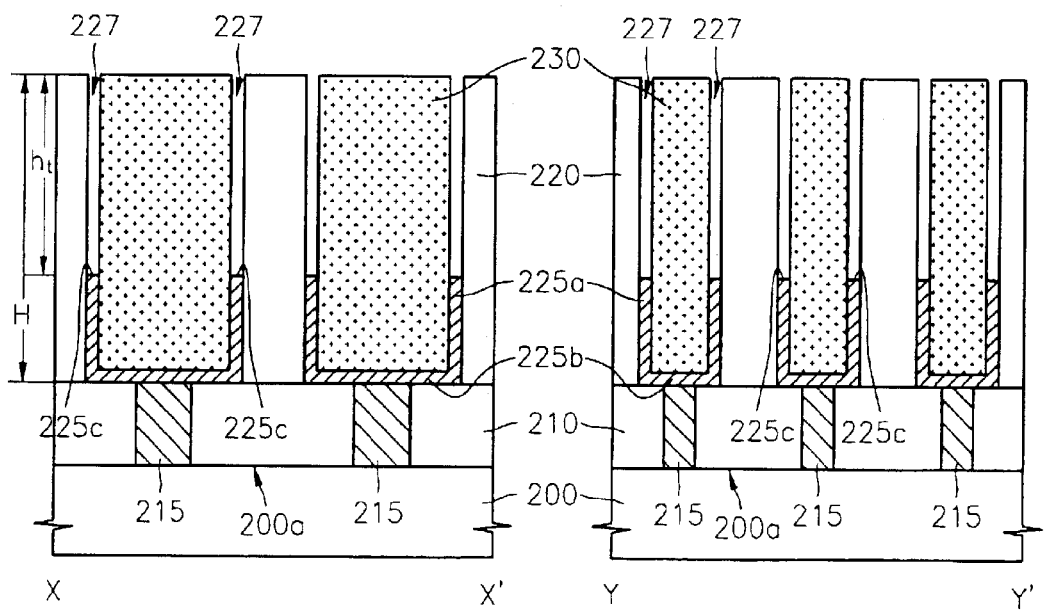

Referring to FIG. 4, a second layer, which may be a first buffer dielectric layer 230, is deposited on the first conductive layer 225. In some embodiments, the first buffer dielectric layer 230 is formed of a material, such as a silicon oxide layer, having good etch selectivity to the first conductive layer 225. The first buffer dielectric layer 230 and the first conductive layer 225 are etched using CMP and/or dry etch back to separate nodes of the first conductive layer 225.

If CMP is used to separate the nodes of the first conductive layer 225, the first conductive layer 225 may be barely recessed. However, if dry etching is used, the first conductive layer 225 may be overetched and thus somewhat recessed. Where the first conductive layer 225 is formed of a material having good etch selectivity to materials forming the buffer dielectric layer 230 and the mold oxide layer 220, the first conductive layer 225 also may be recessed.

As described above, if etch selectivity among materials is high, a process of forming lower storage electrodes 225a and 225b of bilayered capacitor lower electrodes may be performed using the process of separating the nodes of the first conductive layer 225. As in this embodiment, in a case where bilayered-capacitor lower electrodes are manufactured, the first conductive layer 225 may be further etched to secure spaces for making upper storage electrodes.

Alternatively, where the nodes of the first conductive layer 225 are separated using CMP, since portions of the first buffer dielectric layer 230 and the first conductive layer 225 to be etched are planarized, the first conductive layer 225 may not be recessed. After the nodes of the first conductive layer 225 are separated using CMP, an additional process of etching only the first conductive layer 225 may be performed to recess the first conductive layer 225.

In contrast, in a case where the dry etch is used to separate the nodes of the first conductive layer 225 and the etch selectivity between the first buffer dielectric layer 230 and the first conductive layer 225 is good, differences in the etch rates and etch amounts of the first buffer dielectric layer 230 and the first conductive layer 225 can result in the first conductive layer 225 to be overetched and therefore an additional process of forming recessed portions between the mold oxide layer 220 and the first buffer dielectric layer 230 may need not be used. However, although dry etching is used, an additional process of selectively etching only the first conductive layer 225 may be performed in order to overetch or rapidly etch the first conductive layer 225.

In some embodiments, the height ht of the etched portions of the first conductive layer 225, i.e., the height of the recessed portions, is 10–90% of the height H of the capacitor lower electrodes. The height of the recessed portions may be equal to the height of the upper storage electrodes.

Lower storage electrodes 225a and 225b manufactured according to the above-described process are single cylindrical type electrodes. In other words, the lower storage electrodes 225a and 225b are composed of bottoms 225b, which contact the contact plugs 215 and sidewalls 225a, which extend upward from the bottoms 225b and are perpendicular to the bottoms 225b. The first buffer dielectric layer 230 remains within the sidewalls 225a of the lower storage electrodes and the mold oxide layer 220 remains between adjacent lower storage electrodes. Heights of the first buffer dielectric layer 230 and the mold oxide layer 220 are greater than the heights of the sidewalls 225a.

Structures of FIG. 4 also may be viewed as an integrated circuit capacitor electrode which includes an integrated circuit substrate 200 including a face 200a. An insulating layer 220/230 is provided on the face 200a. A conductive ring 225a is provided in the insulating layer 220/230 and including a ring axis (not shown) that extends orthogonal to the face 200a. The conductive ring 225a includes first (inner) and second (outer) ring walls, a ring floor adjacent the face 200a, and a ring roof 225c remote from the face 200a. The insulating layer 220/230 includes a trench 227 therein that exposes the ring roof 225c, but does not expose the ring walls.

Figure 5:
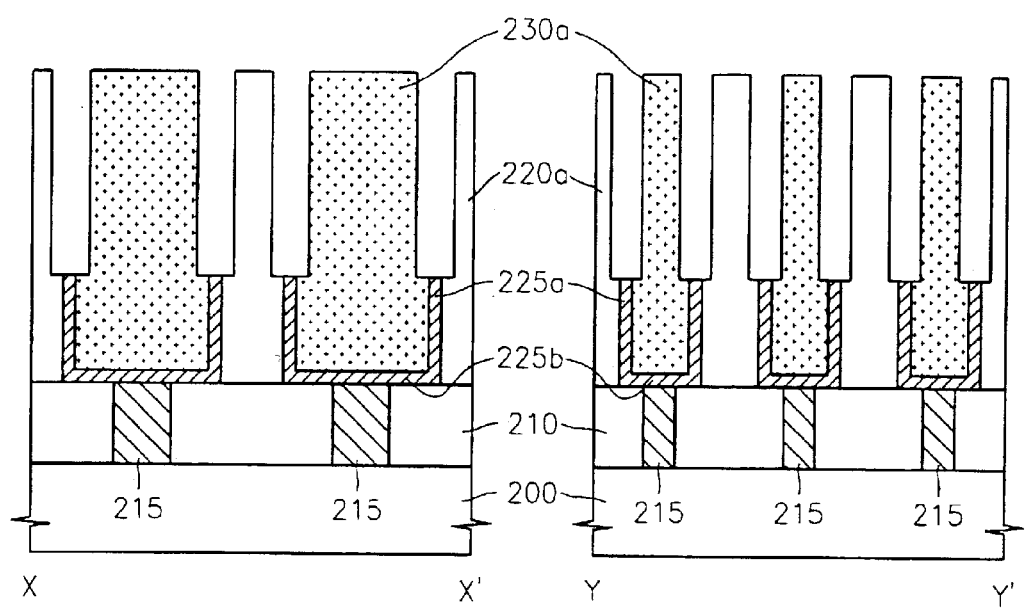

Referring to FIG. 5, portions of the mold oxide layer 220 and portions of the first buffer dielectric layer 230 around spaces in which portions of the first conductive layer 225 were formed, i.e., the recessed portions, are etched, and the spaces, i.e., the recessed portions, become larger. In some embodiments, the mold oxide layer 220 and the first buffer dielectric layer 230 are etched in an amount of a thickness of about 100–500 Å, respectively. Here, the etching process may be dry etching and/or wet etching. Since the sidewalls 225a of lower storage electrodes have good etch selectivity to the mold oxide layer 220 and the first buffer dielectric layer 230, the sidewalls 225a may be hardly etched by dry etching or wet etching.

Also, first buffer dielectric layers 230a having predetermined thicknesses remain within the sidewalls 225a of the lower storage electrodes. The first buffer dielectric layers 230a define areas in which second sidewalls of upper storage electrodes will be formed. A mold oxide layer 220a also remains between adjacent lower storage electrodes. The mold oxide layer 220a defines areas in which first sidewalls of the upper storage electrodes will be formed. As a result, the mold oxide layer 220a and the first buffer dielectric layers 230a define areas in which the upper storage electrodes will be formed.

Referring to FIG. 6, a second conductive layer 235 is conformally deposited on the resultant structure shown in FIG. 5, i.e., on upper portions and sidewalls of the mold oxide layer 220a, upper portions and sidewalls of the first buffer dielectric layers 230a, and the sidewalls 225a of the lower storage electrodes. Like the first conductive layer 225, the second conductive layer 235 may be formed of polysilicon or a metal material. In some embodiments, the thickness of the second conductive layer 235 is within the range of about 100–400 Å. Next, a third layer, which may be a second buffer dielectric layer 240, is deposited on the second conductive layer 235. As with the first buffer dielectric layer 230, the second buffer dielectric layer 240 may be formed of a silicon oxide layer such as conventional PETEOS.

Referring to FIG. 7, the second buffer dielectric layer 240 and the second conductive layer 235 are etched using CMP and/or dry etch back to separate nodes of the second conductive layer 235. As a result, as shown in FIG. 7, upper storage electrodes 235a, 235b, and 235c are formed.

The upper storage electrodes 235a, 235b, and 235c are dual-cylindrical types. In other words, the upper storage electrodes 235a, 235b, and 235c are composed of bottoms 235c and first and second sidewalls 235a and 235b. The bottoms 235c are formed on the sidewalls 225a of the lower storage electrodes. Here, the bottoms 235c of the upper storage electrodes are formed only between the lower edges of the first sidewalls 235a and the second sidewalls 235b, but not inside the lower edges of the second sidewalls 235b since the first buffer dielectric layers 230a remain in the second sidewalls 235b. The first and second sidewalls 235a and 235b are perpendicular to the bottoms 235c. The circumference of the first sidewalls 235a of the upper storage electrodes is larger than the circumference of the sidewalls 225a of the lower storage electrodes, while the circumference of the second sidewalls 235b of the upper storage electrodes is smaller than the circumference of the sidewalls 225a of the lower storage electrodes.

The mold oxide layer 220a, the first buffer dielectric layers 230a, and second buffer dielectric layers 240a are partially or completely removed using wet etching. As a result, as shown in FIG. 8, a semiconductor memory device including bilayered capacitor lower electrodes composed of lower storage electrodes 225a and 225b and upper storage electrodes 235a, 235b, and 235c is manufactured.

According to these embodiments, if the heights of capacitor lower electrodes are equal to the heights of existing capacitor lower electrodes, the capacitor lower electrodes can have effective areas that are wider than effective areas of the existing capacitor lower electrodes. Also, since an existing reliable process may be used to manufacture the capacitor lower electrodes, the stability of the process can be secured. In particular, a process of overetching a first conductive layer to form recessed portions may be performed in situ using the process of separating nodes of the first conductive layer.

Next, semiconductor memory devices manufactured according to embodiments of the present invention will be described with reference to FIGS. 8 and 9.

Referring to FIGS. 8 and 9, an interlevel insulating layer 210 is formed on a semiconductor substrate 200 having semiconductor devices (not shown) such as MOS transistors. Contact plugs 215 are formed and arranged in the interlevel insulating layer 210. The contact plugs 215 electrically connect source areas (not shown) of MOS transistors formed thereunder and capacitor lower electrodes which will be formed in subsequent processes. Capacitor lower electrodes 225a, 225b, 235a, 235b, and 235c are formed over the contact plugs 215 and the interlevel insulating layer 210. Here, the capacitor lower electrodes 225a, 225b, 235a, 235b, and 235c have bilayered structures comprising lower storage electrodes 225a and 225b and the upper storage electrodes 235a, 235b, and 235c.

The lower storage electrodes 225a and 225b can have the same structures as conventional capacitor lower electrodes. In more detail, the lower storage electrodes 225a and 225b are composed of bottoms 225b, which are electrically connected to the contact plugs 215, and sidewalls 225a, which extend from the bottoms 225b to be perpendicular to the bottoms 225b. In other words, the lower storage electrodes 225a and 225b are cylindrical type electrodes in which the sidewalls 225a enclose the bottoms 225b. However, the sidewalls 225a of the lower storage electrodes are single types (hereinafter, referred to as single cylindrical types in order to distinguish the lower storage electrodes from the upper storage electrodes). The lower storage electrodes 225a and 225b may be circular, elliptical, or polygonal such as rectangular.

In some embodiments, the height of the sidewalls 225a is less than the height of the sidewalls 120a of conventional capacitor lower electrodes. This can secure spaces, in which the upper storage electrodes 235a, 235b, and 235c are formed, on the sidewalls 225a of the lower storage electrodes without the need to increase the height of the capacitor lower electrodes. The thickness of the lower storage electrodes 225a and 225b may depend on the design rules, process parameters, structural stability, or the like, and may be within the range of about 100–500 Å. The lower storage electrodes 225a and 225b can comprise polysilicon or a metal material.

The upper storage electrodes 235a, 235b, and 235c are composed of bottoms 235c and two sidewalls, i.e., first and second sidewalls 235a and 235b, that are cylindrical shaped. The upper storage electrodes 235a, 235b, and 235c are formed on the sidewalls 225a of the lower storage electrodes. In more detail, the bottoms 235c of the upper storage electrodes are formed on the sidewalls 225a. The bottoms 235c are electrically connected to the sidewalls 225a. The bottoms 235c are band-shaped and have a predetermined thickness and width. When viewed from above, the bottoms 235c may appear circular, elliptical, or polygonal such as rectangular.

The first and second sidewalls 235a and 235b having predetermined thicknesses are perpendicular to the bottoms 235c. The bottoms 235c are formed only between the lower edge of the first sidewalls 235a and the lower edge of the second sidewalls 235b. In other words, each of the upper storage electrodes 235a, 235b, and 235c are formed by putting one cylindrical structure into another so that the perimeter or circumference of the first sidewalls 235a is larger than the perimeter or circumference of the lower storage electrodes and the perimeter or circumference of the second sidewalls 235b is smaller than the perimeter or circumference of the lower storage electrodes. In this specification, this is referred to as dual cylindrical type. The second sidewalls 235b are open structures with no bottoms.

The height of the first and second sidewalls 235a and 235b may be equal to the difference between the height of the sidewalls 225a of the lower storage electrodes and the height of the sidewalls 120a of a conventional capacitor lower electrode. In this case, the height of the capacitor lower electrodes according to these embodiments may be equal to the height of a conventional capacitor lower electrode. However, the height of the first and second sidewalls 235a and 235b may be less than that of the sidewalls 120a of a conventional capacitor lower electrode.

The thickness of the upper storage electrodes 235a, 235b, and 235c also may depend on the design rules, process parameters, structural stability, and the like, and may be within a range of 100–500 Å. The upper storage electrodes 235a, 235b, and 235c can comprise polysilicon or a metal material.

Cross-sectional structures of the capacitor lower electrodes 225a, 225b, 235a, 235b, and 235c are schematically shown in FIG. 8. Referring to FIG. 8, the lower storage electrodes 225a and 225b, which are connected to the contact plugs 215 and are U-shaped in cross-section, are formed on the interlevel insulating layer 210. The upper storage electrodes 235a, 235b, and 235c are also formed on the sidewalls 225a of the lower storage electrodes. Although in the cross-sectional structures, separate structures appear to be formed on the sidewalls 225a of the lower storage electrodes, as described previously, the bottoms 235c of the upper storage electrodes are band-shaped, and the first and second sidewalls 235a and 235b are connected.

Embodiments of FIG. 8 may also be regarded as providing an integrated circuit capacitor electrode that comprises a first conductive ring 225a on a face 200a of an integrated circuit substrate 200, and including a first ring axis that extends orthogonal to the face 200a. A second conductive ring 235a is provided on the first conductive ring opposite the substrate 200 and including a second ring axis that also extends orthogonal to the face. A third conductive ring 235b is also provided on the first conductive ring opposite the substrate and including a third ring axis that also extends orthogonal to the face. The third ring 235b is located at least partially within the second ring 235a. A conductive layer 235c electrically connects the first 225a, second 235a and third 235b rings. The first conductive ring 225a, the second conductive ring 235a and/or the third conductive ring 235b may be ellipsoidal or polygonal in shape. The first, second and third rings may be coaxial. Moreover, as shown in FIG. 8, the perimeter of the second ring 235a may be greater than that of the first ring 225a, and the perimeter of the third ring 235b may be less than that of the first ring 225a. Finally, as shown in FIG. 8, the conductive layer 235c may comprise a fourth ring that extends between the second 235a and third 235b rings adjacent the first ring 225a, but not within the third ring 235b.

In some embodiments, the height ht of the upper storage electrodes 235a, 235b, and 235c is within the range of about 10–90% of the height H of the capacitor lower electrodes. The height ht of the upper storage electrodes 235a, 235b, and 235c may depend on the desired capacitance, structural stability of capacitors, a manufacturing process, and the like. In FIG. 8, the height ht of the upper storage electrodes 235a, 235b, and 235c account for about 60% of the height H of the capacitor lower electrodes.

Figure 2:
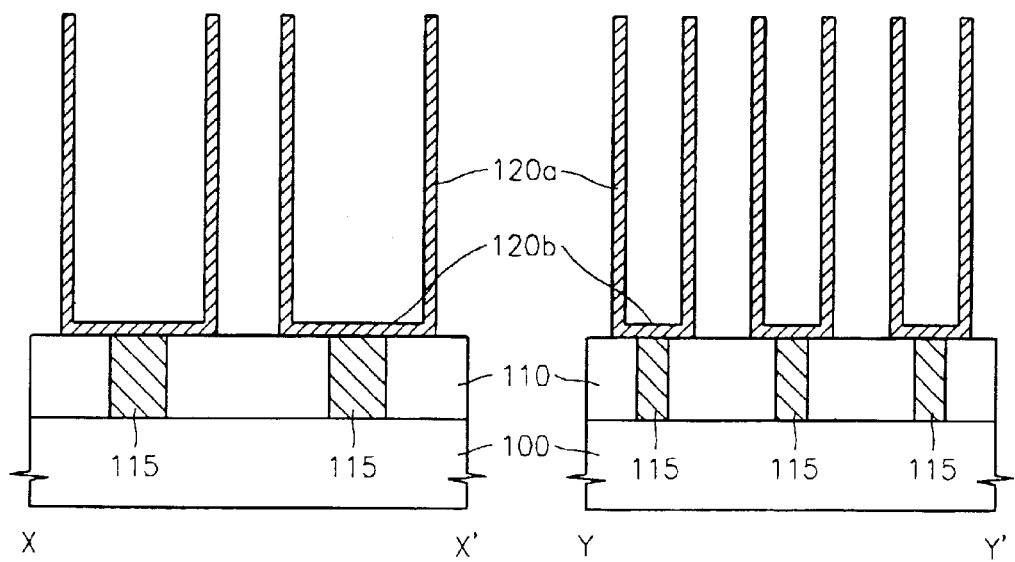
FIG. 2 is a schematic cross-sectional view taken along lines X–X' and Y–Y' of FIG. 1.

By taking as an example a case where the height ht of the upper storage electrodes 235a, 235b, and 235c account for 50% of the height H of the capacitor lower electrodes, variations in capacitance will be considered. In a case where the height H of the capacitor lower electrodes is identical to the height of the general cylindrical capacitor lower electrodes shown in FIGS. 1 and 2, the capacitor lower electrodes can have effective areas that are increased 35% more than the general cylindrical capacitor lower electrodes. This is because the sidewalls 235a and 235b of the upper storage electrodes are separated into branches like flower leaves to increase the total surface area. Thus, according to the above-described example, it is possible to manufacture capacitors having capacitances 35% higher than that of existing capacitors.

The ratio of the height ht of the upper storage electrodes may be increased more to manufacture capacitors having larger capacitances. However, increasing the ratio of the heights ht of the upper storage electrodes may have limitations. Structural stability and manufacturing processes thereof are factors that may confine the increase in the ratio of the height ht of the upper storage electrodes.

Also, according to these embodiments, it is possible to manufacture capacitors having identical capacitances to those of existing capacitors. In this case, the height H of the capacitor lower electrodes can be less than the height of existing capacitor lower electrodes. The height H of the capacitor lower electrodes may be reduced to about two-thirds the height of the existing capacitor lower electrodes since the effective area of capacitors according to these embodiments has been increased. As a result, capacitances do not increase, but the likelihood that the capacitor lower electrodes will slant can be remarkably reduced.

According to those embodiments, capacitor lower electrodes have bilayered structures composed of lower storage electrodes and upper storage electrodes. Also, the lower storage electrodes are single cylindrical type electrodes while the upper storage electrodes are dual cylindrical type electrodes. The upper storage electrodes of the dual cylindrical type each include two sidewalls. Thus, the capacitor lower electrodes of the bilayered structures can have effective areas that are wider than those of capacitor lower electrodes of single-layered cylindrical structures. Accordingly, capacitances of capacitors can be increased without increasing the height of the capacitor lower electrodes. Also, although the height of the capacitor lower electrodes may be reduced, capacitances equal to existing capacitances can be secured. In this case, the capacitor lower electrodes can also be reduced or prevented from slanting. Finally, in methods of manufacturing semiconductor memory devices according to the present invention, since an existing verified process can be used as a process of forming capacitor lower electrodes, the method can be stable and simple.

Figure 13:
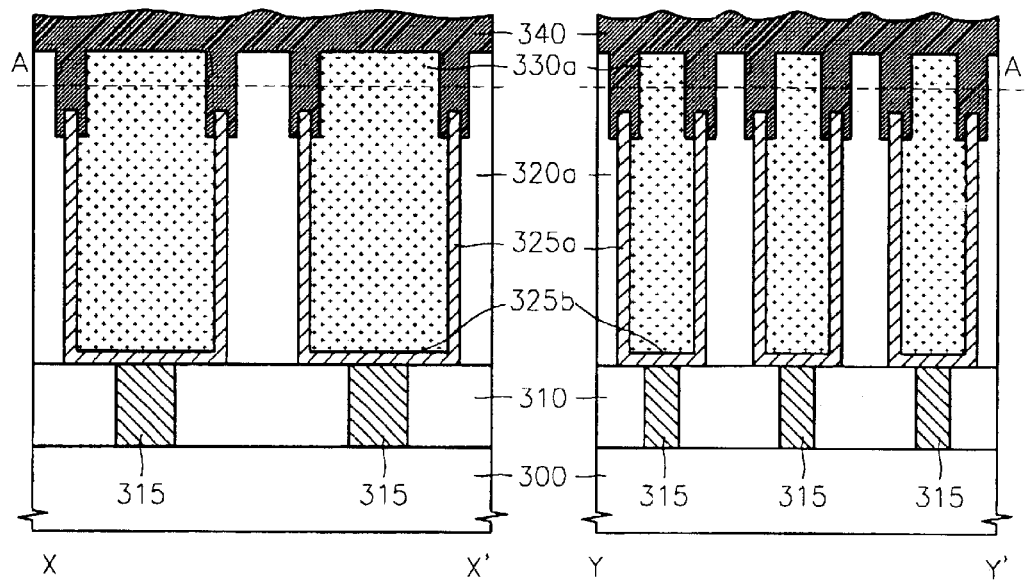
Figure 14:
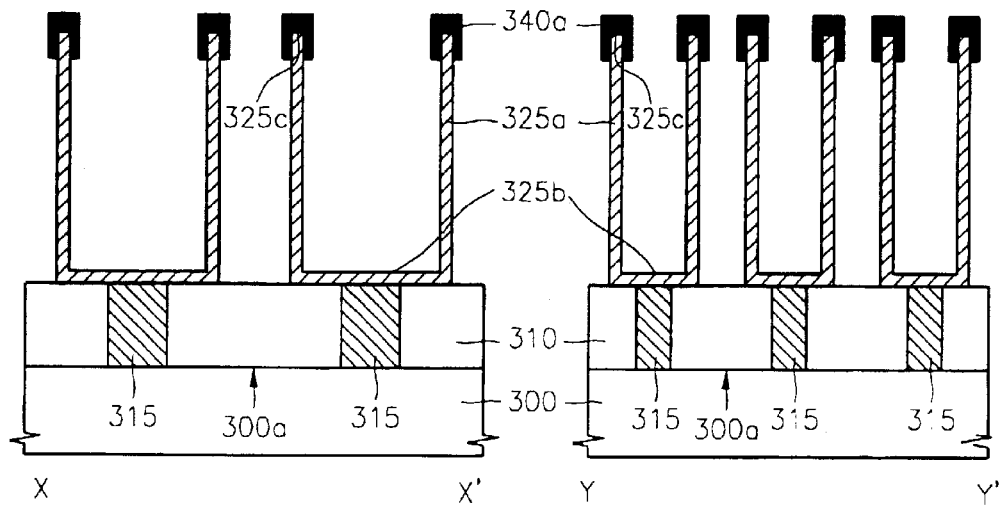
Figure 15:
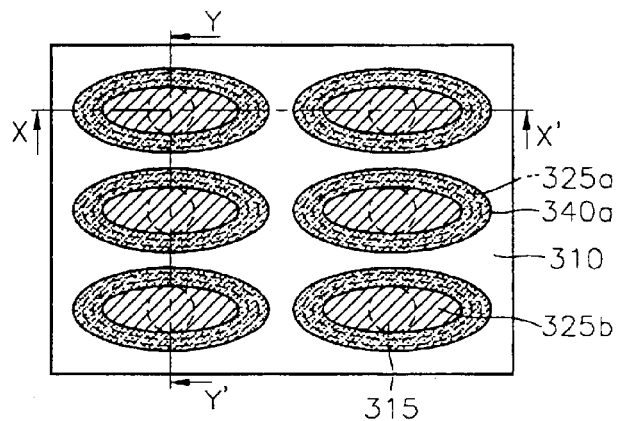
FIG. 15 is a plan view of semiconductor memory devices of FIG. 14.

FIGS. 10 through 15 are cross-sectional views of methods of manufacturing semiconductor memory devices according to second embodiments and showing the semiconductor memory devices manufactured according to these methods. FIGS. 10 through 14 are cross-sectional views illustrating sequential steps of the methods, and FIG. 15 is a plan view of semiconductor memory devices of FIG. 14. FIGS. 10 through 14 are cross-sectional views taken along lines X–X' and Y—Y of FIG. 15.

Figure 10:
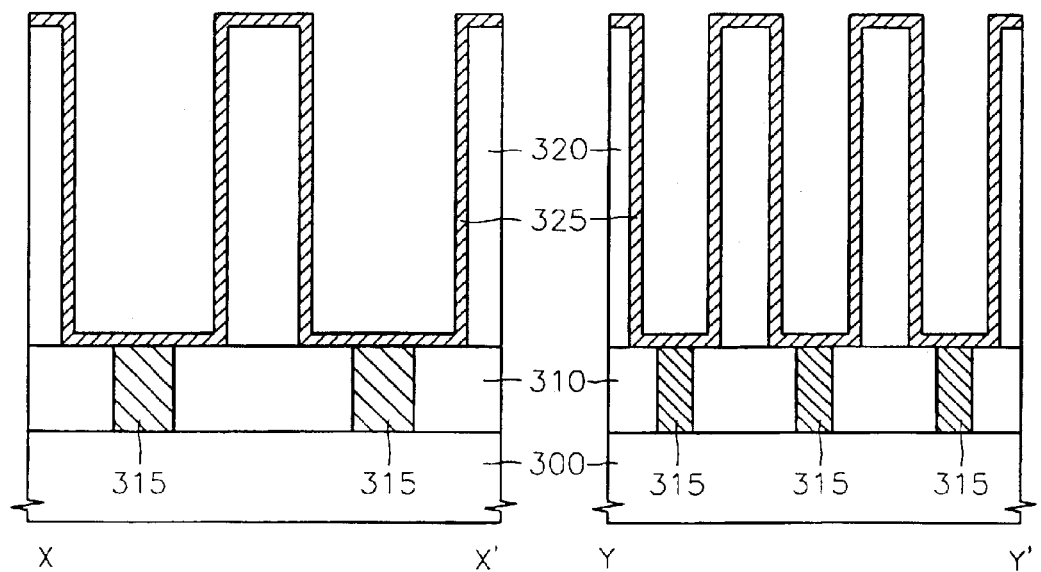
FIGS. 10 through 14 are schematic cross-sectional views of methods of manufacturing a semiconductor memory device according to other embodiments of the present invention.

Referring to FIG. 10, processes of depositing an interlevel insulating layer 310 on a semiconductor substrate 300 and forming contact plugs 315 in the interlevel insulating layer 310 can be the same as existing processes. Next, an etch stopper (not shown) is deposited on the entire surface of the resultant structure. The etch stopper may be formed of a nitride layer. A first layer, such as a mold oxide layer, is deposited on the etch stopper to the height of capacitor lower electrodes to be formed. Mold oxide patterns, which define areas in which capacitor lower electrodes 325a and 325b will be formed, are formed using photolithography. The contact plugs 315 are exposed by removing exposed portions of the etch stopper. A conductive layer 325 is conformally deposited on the entire surface of the resultant structure. The conductive layer 325 can comprise polysilicon or a metal material.

Figure 11:
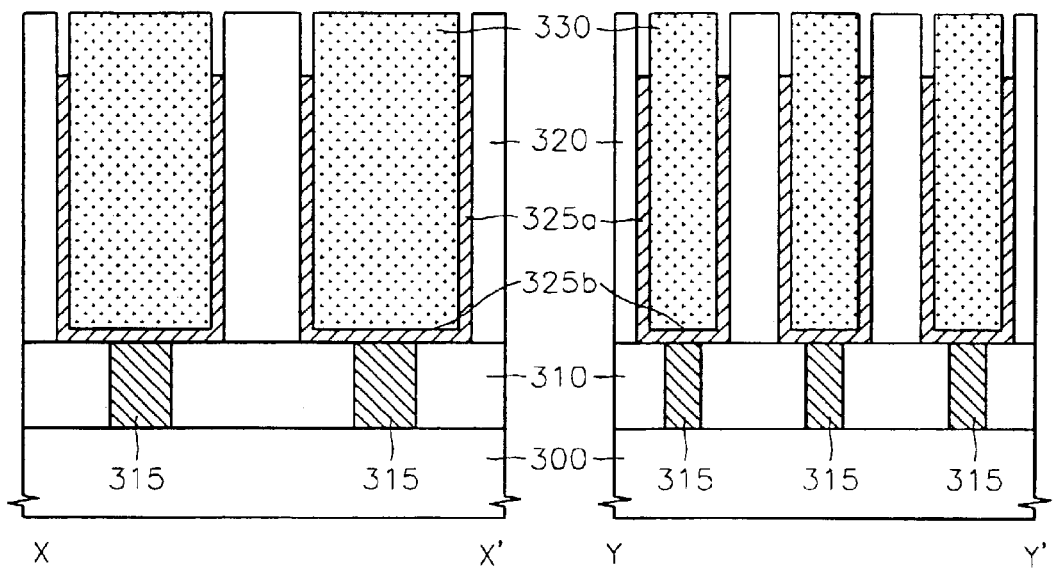

Referring to FIG. 11, a buffer dielectric layer (not shown) is deposited on the conductive layer 325, and the buffer dielectric layer and the conductive layer 325 are etched using CMP and/or dry etch back so as to separate nodes of the conductive layer 325. As a result, the capacitor lower electrodes 325a and 325b are formed. Thereafter, only sidewalls 325a of the capacitor lower electrodes are further etched to form recessed portions. As a result, the sidewalls 325a are lower than mold oxide layer 320 and buffer dielectric layer 330. Where the nodes of the conductive layer 325 are separated using dry etch back, as in the first embodiments, the formation of the recessed portions may be achieved in situ by taking advantage of the difference in etch selectivity between the buffer dielectric layer and the conductive layer 325.

Figure 12:
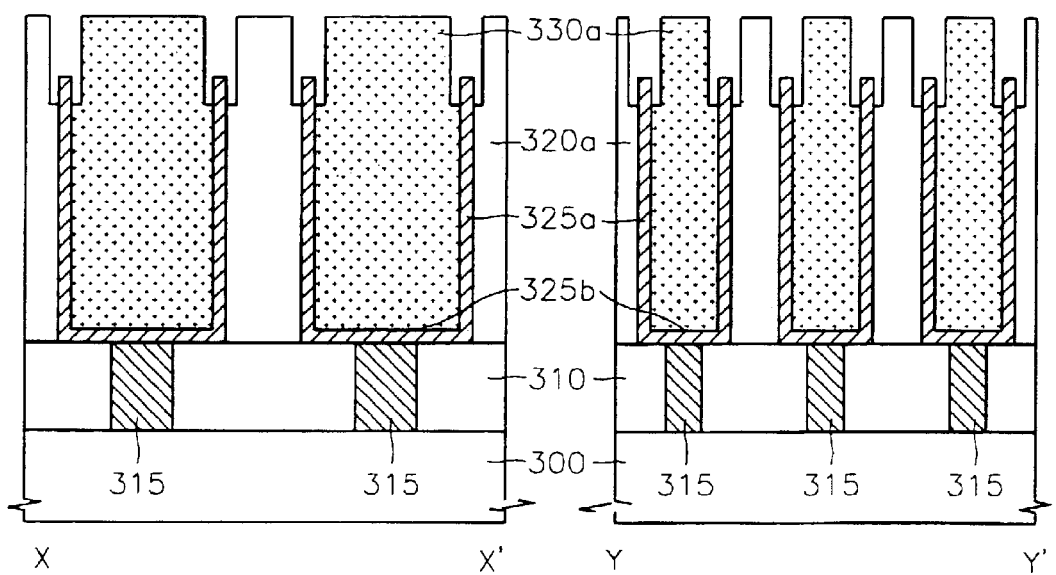

Referring to FIG. 12, portions of the mold oxide layer 320 and portions of the buffer dielectric layers 330 around the capacitor lower electrodes 325a and 325b are etched, for example, using wet etching. Portions of the mold oxide layer 320 are etched in the Y–Y' direction as well as in the X–X' direction. In this embodiment, the mold oxide layer 320 is etched in both X–X' and Y–Y' directions, leaving an etched mold oxide layer 320a between the capacitor lower electrodes 325a and 325b. As a result, areas in which caps will be formed are defined by the etched mold oxide layer 320a and etched buffer dielectric layers 330a remaining around the capacitor lower electrodes 325a and 325b.

Referring to FIG. 13, a dielectric layer 340 is deposited on the entire surface of the resultant structure. The dielectric layer 340 is formed on the etched mold oxide layer 320a and the etched buffer dielectric layers 330a as well as in areas in which the caps will be formed. The dielectric layer 340 may comprise a nitride layer.

In FIG. 13, the dashed line A represents a depth to which the dielectric layer 340, the mold oxide layer 320a, and the buffer dielectric layers 330a are etched using CMP. In some embodiments, the position of the dashed line A is higher than the sidewalls 325a of the capacitor lower electrodes. However, in a case where the dielectric layer 340 is not completely removed, the position of the dashed line A may be lower than the sidewalls 325a. This is because when the capacitor lower electrodes 325a and 325b slant, contacting portions of the capacitor lower electrodes 325a and 325b are upper portions of the sidewalls 325a. Even if the sidewalls 325a contact each other, portions of the dielectric layer 340 around the sidewalls 325a can prevent the electrical connection of the sidewalls 325a.

After the dielectric layer 340, the etched mold oxide layer 320a, and the etched buffer dielectric layers 330a are etched to the dotted line A, the semiconductor memory device in which the caps 340a are formed on the capacitor lower electrodes 325a and 325b is completed as shown in FIG. 14.

As shown in FIGS. 14 and 15, the circumferential shapes and the arrangement of the capacitor lower electrodes 325a and 325b of the semiconductor memory device according to these embodiments can be identical to the circumferential shapes and the arrangement of existing capacitor lower electrodes. However, the caps 340a, which enclose portions of the sidewalls 325a, are formed of a dielectric material on the upper portions of the sidewalls 325a of the capacitor lower electrodes.

In these embodiments, the caps 340a are separately formed on each of the capacitor lower electrodes 325a and 325b. Thus, even if the capacitor lower electrodes 325a and 325b slant, since only portions of the dielectric material contact each other, adjacent capacitor lower electrodes 325a and 325b are electrically insulated from each other.

Also, it may be unnecessary to form the caps 340a on all of the sidewalls 325a of the capacitor lower electrodes. In other words, the caps 340a may be alternatively formed on the capacitor lower electrodes 325a and 325b arranged in the form of matrix. Also in this case, since one of the two sidewalls 325a that contact each other is enclosed by one of the caps 340a, defects in the semiconductor memory device can be reduced or prevented.

Accordingly, integrated circuit capacitor electrodes according to these embodiments of the present invention may include an integrated circuit substrate 300 including a face 300a. A conductive ring 325a is provided on the face of the integrated circuit substrate 300. The conductive ring 325a includes a ring axis that extends orthogonal to the face 300a. The conductive ring includes first (inner) and second (outer) ring walls, a ring floor adjacent the face 300, and a ring roof 325c remote from the face 300a. A conformal insulating cap 340a is provided on the roof 325c and extending on the first ring wall and/or on the second ring wall only partially to the floor.

Figure 16:
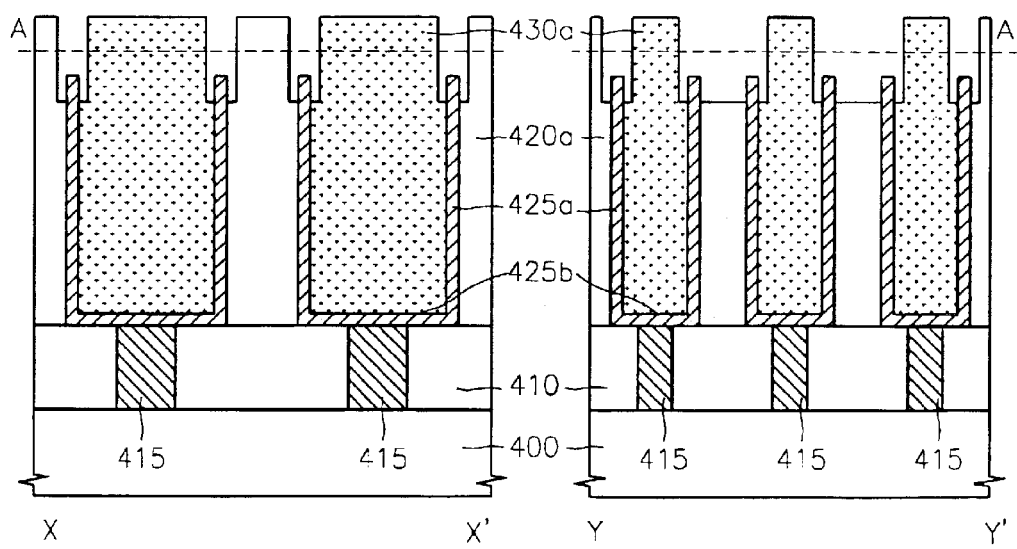
FIGS. 16 through 18 are schematic cross-sectional views of methods of manufacturing a semiconductor memory devices according to still other embodiments of the present invention.
Figure 17:
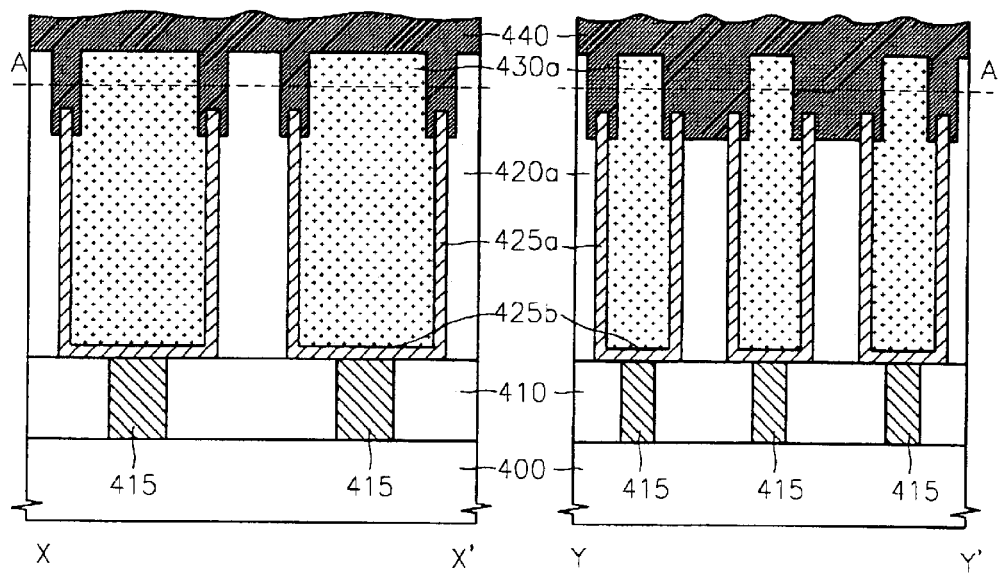
Figure 18:
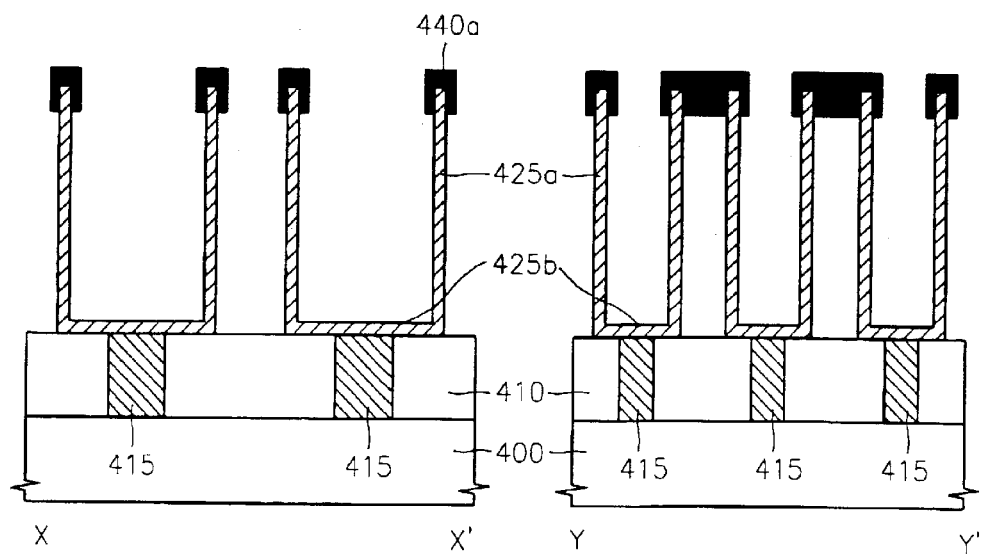
Figure 19:
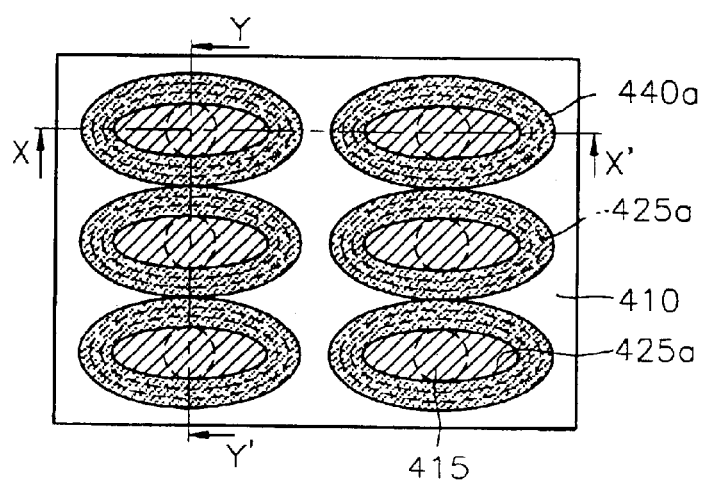
FIG. 19 is a plan view of semiconductor memory devices of FIG. 18.

FIGS. 16 through 19 are cross-sectional views of methods of manufacturing semiconductor memory devices according to third embodiments of the present invention and showing semiconductor memory devices manufactured using these methods. FIGS. 16 through 18 are cross-sectional views illustrating sequential steps of the methods, and FIG. 19 is a plan view of semiconductor memory devices of FIG. 18. FIGS. 16 through 18 are cross-sectional views taken along lines X–X' and Y–Y of FIG. 19.

The steps of the second embodiments described with reference to FIGS. 11 and 12 may be applied to this embodiment. Reference numerals in the second embodiments are changed in these embodiments so as to distinguish these embodiments from the second embodiments. For example, the semiconductor substrate is changed from 300 to 400, the contact plugs from 315 to 415, and the interlevel insulating layer from 310 to 410. Other reference numerals are not shown in the drawings but remain the same. Steps that will be described with reference to FIG. 16 are performed after the steps described with reference to FIG. 12.

Referring to FIG. 16, portions of a mold oxide layer 420 and a buffer dielectric layer 430 around capacitor lower electrode 425a and 425b are etched. Wet etch may be used. Portions of the mold oxide layer 420 are etched in the Y–Y' direction as well as in the X–X' direction. However, in this case, portions of the mold oxide layer 420 between sidewalls 425a of the capacitor lower electrodes are completely etched to a predetermined depth in one direction, e.g., in direction Y–Y', in FIG. 16.

In FIG. 16, portions of the mold oxide layer 420 in the Y–Y' direction are completely etched to a predetermined depth. As a result, an etched mold oxide layer 420a and etched buffer dielectric layers 430a define areas in which caps will be formed, around the capacitor lower electrodes 425a and 425b.

Referring to FIG. 17, as in FIG. 13, a dielectric layer 440 for caps is deposited on the resultant structure. Next, the dielectric layer 440, the etched mold oxide layer 420a, and the etched buffer dielectric layer 430a are etched to a dashed line A. Then, as shown in FIG. 18, a semiconductor memory device in which caps 440a are formed on the sidewalls 425a of the capacitor lower electrodes is manufactured.

As seen in FIGS. 17 and 18, the formation of the caps 440a on the sidewalls 425a of the capacitor lower electrodes can be identical as the same steps in the second embodiments. However, in these embodiments, adjacent caps 440 are connected in one direction in which the capacitor lower electrodes 425a and 425b are arranged, e.g., in the Y–Y' direction. This results from completely etching portions of the mold oxide layer 420 between the sidewalls 425a of the capacitor lower electrodes to a predetermined depth in the step described with reference to FIG. 16.

Accordingly, electrical connection between adjacent storage electrodes can be reduced or prevented. Also, since the capacitor lower electrodes 425a and 425b are supported by the caps 440a, the capacitor lower electrodes 425a and 425b can be reduced or prevented from slanting. In the case where the circumferential shapes of the capacitor lower electrodes 425a and 425b are elliptical or rectangular, since the capacitor lower electrodes 425a and 425b may more easily slant in the minor direction, the capacitor lower electrodes 425a and 425b may be formed so as to share caps 440a in this direction. Furthermore, as described in the second embodiments, the caps 340a may be alternatively formed on capacitor lower electrodes which are regularly arranged in the form of matrix.

According to the second and third embodiments of the present invention, caps are formed on sidewalls of capacitor lower electrodes so as to enclose upper portions of the sidewalls. Thus, even if the capacitor lower electrodes slant, the capacitor lower electrodes can be electrically insulated from each other. Also, in the case of a semiconductor memory device in which adjacent capacitor lower electrodes share caps, the capacitor lower electrodes can be reduced or prevented from slanting.

It also will be understood that multilayer integrated circuit capacitor electrodes may include caps in some embodiments, and may be free of other caps in other embodiments. Accordingly, the second and/or third embodiments may be used alone or in combination with the first embodiments.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A semiconductor memory device comprising bilayered capacitor lower electrodes including lower storage electrodes, which comprise single cylindrical type electrodes including first bottoms and single sidewalls, and upper storage electrodes, which comprise dual cylindrical type electrodes including second bottoms and first and second sidewalls having different sizes, wherein the first sidewalls are positioned outside the sidewalls of the lower storage electrodes, the second sidewalls are positioned inside the sidewalls of the lower storage electrodes, and the second bottoms are positioned on the sidewalls of the lower storage electrodes and extend between lower edges of the first sidewalls and lower edges of the second sidewall, but not inside of the lower edges of the second sidewalls.

2. The semiconductor memory device of claim 1, wherein the capacitor lower electrodes comprise polysilicon or a metal material.

3. The semiconductor memory device of claim 1, wherein the height of the upper storage electrodes accounts for about 10–90% of the height of the capacitor lower electrodes.

4. The semiconductor memory device of claim 1, wherein the circumferential shapes of the lower and upper storage electrodes are polygonal, elliptic, or circular.

5. The semiconductor memory device of claim 1, further comprising:

a dielectric layer on the capacitor lower electrodes; and capacitor upper electrodes on the dielectric layer.

6. An integrated circuit capacitor electrode comprising:

a first conductive ring on a face of an integrated circuit substrate, and including a first ring axis that extends orthogonal to the face;

a second conductive ring on the first conductive ring opposite the substrate and including a second ring axis that extends orthogonal to the face;

a third conductive ring on the first conductive ring opposite the substrate and including a third ring axis that extends orthogonal to the face, the third ring being located at least partially within the second ring; and a conductive layer that electrically connects the first, second and third rings.

7. An integrated circuit capacitor electrode according to claim 6 wherein the first conductive ring, the second conductive ring and/or the third conductive ring are ellipsoidal or polygonal in shape.

8. An integrated circuit capacitor electrode according to claim 6 wherein the first, second and third conductive rings are coaxial.

9. An integrated circuit capacitor electrode according to claim 6 wherein a perimeter of the second ring is greater than a perimeter of the first ring and wherein a perimeter of the third ring is less than a perimeter of the first ring.

10. An integrated circuit capacitor electrode according to claim 6 wherein the conductive layer comprises a fourth ring that extends between the second and third rings adjacent the first ring, but not within the third ring.

11. An integrated circuit capacitor electrode according to claim 6 further comprising a conformal insulating cap on the second and/or third ring, opposite the first ring.

12. An integrated circuit capacitor electrode comprising:

an integrated circuit substrate including a face;

an insulating layer on the face of the integrated circuit substrate; and a conductive ring in the insulating layer, and including a ring axis that extends orthogonal to the face, first and second ring walls, a ring floor adjacent the face and a ring roof remote from the face, the insulating layer including a trench therein that exposes the ring roof but does not expose the ring walls.

13. An integrated circuit capacitor electrode according to claim 12 wherein the conductive ring is ellipsoidal or polygonal in shape.

14. An integrated circuit capacitor electrode comprising:

an integrated circuit substrate including a face;

a conductive ring on the face of the integrated circuit substrate, and including a ring axis that extends orthogonal to the face, first and second ring walls, a ring floor adjacent the face and a ring roof remote from the face; and a conformal insulating cap on the roof and extending on the first ring wall only partially to the floor.

15. An integrated circuit capacitor electrode according to claim 14 wherein the conductive ring is ellipsoidal or polygonal in shape.

16. An integrated circuit capacitor electrode according to claim 14 wherein the conformal insulating cap also extends on the second ring wall only partially to the floor.

* * * * *